United States Patent [19]

Lieber et al.

[11] Patent Number: 5,252,835
[45] Date of Patent: Oct. 12, 1993

[54] MACHINING OXIDE THIN-FILMS WITH AN ATOMIC FORCE MICROSCOPE: PATTERN AND OBJECT FORMATION ON THE NANOMETER SCALE

[75] Inventors: Charles M. Lieber, Lexington; Yun Kim, Cambridge, both of Mass.

[73] Assignee: President and Trustees of Harvard College, Cambridge, Mass.

[21] Appl. No.: 916,215

[22] Filed: Jul. 17, 1992

[51] Int. Cl.⁵ .............................................. G21K 5/10
[52] U.S. Cl. .................................................. 250/492.1
[58] Field of Search ................. 250/492.1, 492.2, 492.3

[56] References Cited

PUBLICATIONS

Kim et al., "Characterization of nanometer scale wear and oxidation of transition metal dichalcogenide lubricants by atomic force microscopy", Appl. Phys. Lett., 59(26):3404-3406 (1991).
Delawski et al., "Layer-by-Layer Etching of Two-Dimentional Metal Chalcogenides with the Atomic Force Microscope", J. Am. Chem. Soc., 114(5):1661-1667 (1992).
Leung et al., "Orientational Ordering of Polymers by Atomic Force Microscopr Tip-Surface Interaction", Science, 255 64-66 (1992).
Mate et al., "Atomic Force Microscope Studies of Lubricant Films on Solid Surfaces", Vacuum, 41 1283-1286 (1990).
Garfunkel et al., "Scanning Tunneling Microscopy and Nanolithography on a Conducting Oxide, $Rb_{0.3}MoO_3$", Science, 246 99-100 (1989).
Mamin et al., "Gold Deposition from a Scanning Tunneling Microscope Tip", J. Vac. Sci. Technol., 9(2):1398-1402 (1991).
Dagata et al., "Modification of Hydrogen-Passivated Silicon by a Scanning Tunneling Microscope Operating in Air", Appl. Phys. Lett., 56(20):2001-2003 (1990).
Dobisz et al.. "Sub-30 nm Lithography in a Negative Electron Beam Resist with a Vacuum Scanning Tunneling Microscope", Appl. Phys. Lett., 58(22):2526-2528 (1991).
Whitman et al.,"Manipulation of Adsorbed Atoms and Creation of New Structures on Room-Temperature Surfaces with a Scanning Tunneling Microscope", Science, 251, 1206-1210 (1991).
Eigler et al., "An Atomic Switch Realized with the Scanning Tunnelling Microscope", Nature, 352, 600-603 (1991).
Dujardin et al., "Dissociation of Individual Molecules with Electrons from the Tip of a Scanning Tunneling Microscope", Science, 255, 1232-1235 (1992).
Lyo et al., "Field-Induced Nanometer- to Atomic-Scale Manipulation of Silicon Surfaces with the STM", Science, 253, 173-176 (1991).
Wise et al., "Microfabrication Techniques for Integrated Sensors and Microsystems", Science, 254, 1335-1342 (1991).

Primary Examiner—Jack I. Berman
Attorney, Agent, or Firm—Hamilton, Brook, Smith & Reynolds

[57] ABSTRACT

An atomic force microscope (AFM) has been used to machine complex patterns and to form free structural objects in thin layers of $MoO_3$ grown on the surface of $MoS_2$. The AFM tip can pattern lines with $\leq 10$ nm resolution and then image the resulting structure without perturbation by controlling the applied load. Distinct $MoO_3$ structures can also be defined by AFM machining, and furthermore, these objects can be manipulated on the $MoS_2$ substrate surface using the AFM tip. These results suggest application to nanometer scale diffraction gratings, high-resolution lithography masks, and possibly the assembly of nanostructures with novel properties.

1 Claim, 6 Drawing Sheets

MACHINING OXIDE THIN-FILMS WITH AN ATOMIC FORCE MICROSCOPE: PATTERN AND OBJECT FORMATION ON THE NANOMETER SCALE

The ability to manipulate matter and to assemble novel structures on the atomic to nanometer scale is currently a goal of many researchers in the physical and engineering sciences (1-15). One attractive strategy for achieving this goal is to use scanning probe microscopes, such as the scanning tunneling microscope (STM) or atomic force microscope (AFM), to move atoms or clusters of atoms directly into a desired configuration. For example, the STM has been used to remove single atoms from surfaces (2,3), to position atoms on a surface (4, 5), and to create an atomic switch (6). On a nanometer scale the STM has also been used to create structures by field-assisted diffusion (5,7), to develop organic resists (8), to expose passivated semiconductor surfaces (9), and to deposit gold islands on gold surfaces (10). Most recently researchers have utilized the STM to induce the dissociation of a single molecule on a silicon surface (11). In contrast, there are few examples of controlled, highresolution manipulation using the AFM. Several groups have shown that direct contact (repulsive mode) imaging of soft organic layers under sufficiently high loads can lead to orientational ordering of the organic and/or removal of this layer from the area scanned by the AFM tip (12, 13). The length-scale or resolution of these modifications typically has been $\geq 100$ nm. In addition, AFM tip-induced wear of transition metal dichalogenide materials has been reported (14,15) on a $\geq 50$ nm scale. The results from these AFM studies are promising, however, the resolution and control of the surface features produced by the AFM are poor compared to structures created with the STM.

We believe that the materials used in these previous AFM studies have significantly limited the attainable resolution and selectivity. Hence, we have sought to explore the limits of direct surface manipulation with the AFM using a novel material system that consists of a thin ($<50$ Å) metal oxide film ($MoO_3$) on the surface of $MoS_2$. In comparison to previous studies, this system has several unique features, including: (1) the thin $MoO_3$ film is rigid and nondeformable in contrast to organic layers; (2) $MoO_3$ can be selectively machined or imaged depending on the applied load of the AFM cantilever, and (3) the $MoS_2$ substrate, which is a good lubricant, functions as an integral stop layer that automatically fixes the depth of the structures. Using this system we demonstrate herein controlled pattern development with $\leq 10$ nm resolution, and complex machining of movable objects that have nanometer dimensions. The generalization of these results to other materials and their potential applications to nanotechnologies are discussed.

This crystallites of $\alpha$-$MoO_3$ were grown on the surface of single-crystal 2H-$MoS_2$ by thermal oxidation using purified $O_2$ at 480° C. for 5-10 minutes. The $MoO_3$ layers were identified by transmission electron diffraction, X ray photoemission spectroscopy, and atomic resolution AFM images (16). These studies have shown that $\alpha$-$MoO_3$ (space-group Pbnm) grows with the b-axis (13.848 Å) perpendicular to the $MoS_2$ substrate surface. For the above oxidation conditions $MoO_3$ crystallics 1-3 unit cells thick (1-unit cell-b-axis=13.85 Å) and 200-500 nm on edge are formed.

Additional details of the $MoS_2$ oxidation process and the characterization of the $MoO_3$ thin crystal layers will be discussed in detail elsewhere (16). All of the AFM experiments were carried out using a modified commercial instrument (Nanoscope, Digital Instruments, Inc.). $Si_3N_4$ cantilever/tips ($k \approx 0.38$ N/m) were used for imaging and modification. In addition, the AFM experiments were carried out in nitrogen filled glove box equipped with a purification system that reduced the concentrations of oxygen and water to less than 5 ppm and 2 ppm, respectively. This environment enables us to obtain the reproducible conditions needed for controlled surface modification (17).

Figure 1A:
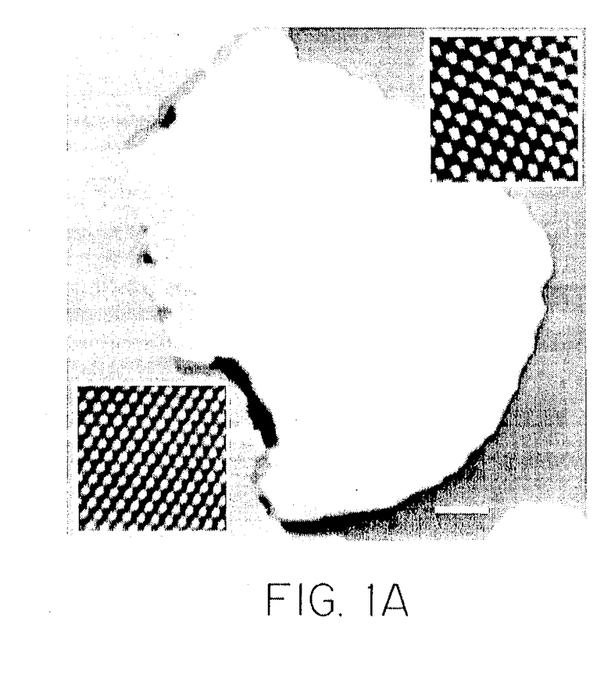
FIGS. 1A-1F show a series of AFM images that depict the patterning of a $MoO_3$ crystallite with the letters "HU".

A typical image of $MoO_3$ crystallite formed after thermal oxidation of $MoS_2$ at 480° C. is shown in FIG. 1a. The $MoO_3$ has a thickness of ca. 15 Å (corresponding to one unit cell along b) and occupies most of the central portion of this $500 \times 500$ nm$^2$ image. Atomic-resolution images confirm this structural assignments: the a-c plane of $MoO_3$ has orthorhombic symmetry, a=3.97 Å, and c=3.70 Å, and the (0001) surface of $MoS_2$ has hexagonal symmetry, a=3.16 Å (insets, FIG. 1A). In addition, it is important to note that the $MoO_3$ and $MoS_2$ surfaces are stable to repetitive scanning when the imaging force is $\leq 10^{-8}$N.

Figure 1B:
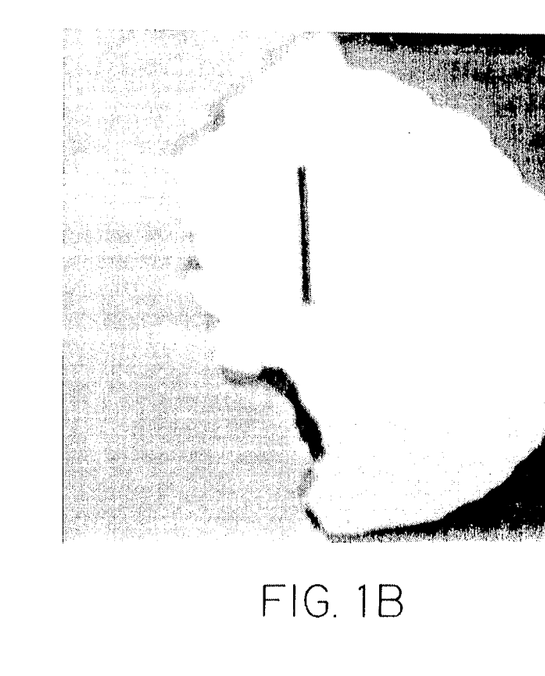
Figure 1C:
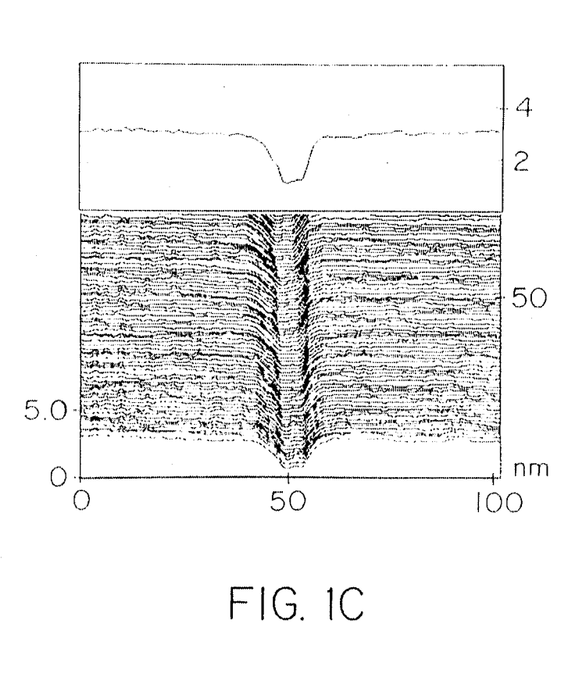

However, when the applied force is increased to $\geq 5 \times 10^{-8}$N we find that the $MoO_3$ surface can be machined in a controlled manner with high-resolution. In FIG. 1B we show an image of the same area of the surface acquired after machining a line in the $MoO_3$ thin film. The line has a resolution of $\simeq 10$ nm at the $MoO_3$ surface and 5 nm at its bottom, and is approximately one unit cell deep (18). These features are shown clearly in a 3-dimensional line scan image and cross-sectional view (FIG. 1C). From this latter data it is also clear that the structure is microscopically very smooth. In addition, we find that continued scanning does not lead to features deeper than the thickness of the $MoO_3$ thin-layer. It is thus apparent that the $MoS_2$ substrate, which is a good solid lubricant, functions as a self-limiting stop in this modification process. We believe that the mechanism by which this structure is created is simply tip-induced wear of the $MoO_3$ surface. Our experimental data strongly supports this mechanistic assignment since we find that the rate of structure formation is proportional to the applied load ($\geq 5 \times 10^{-8}$N) and to the scan rate (35-470 nm/s). Furthermore, the cross-section of the line (FIG. 1C) matches the $Si_3N_4$ tip shape determined by electron microscopy. In analogy to macroscopic processes, this tip-induced wear can be termed "nanomachining".

Figure 1D:
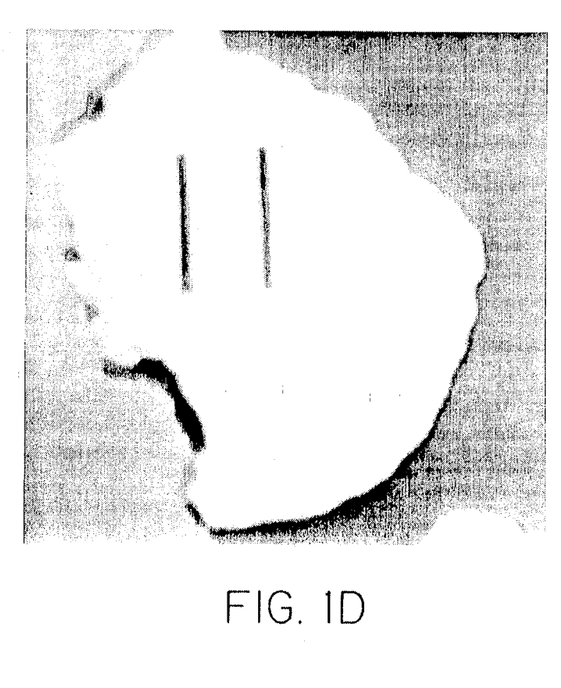
Figure 1E:
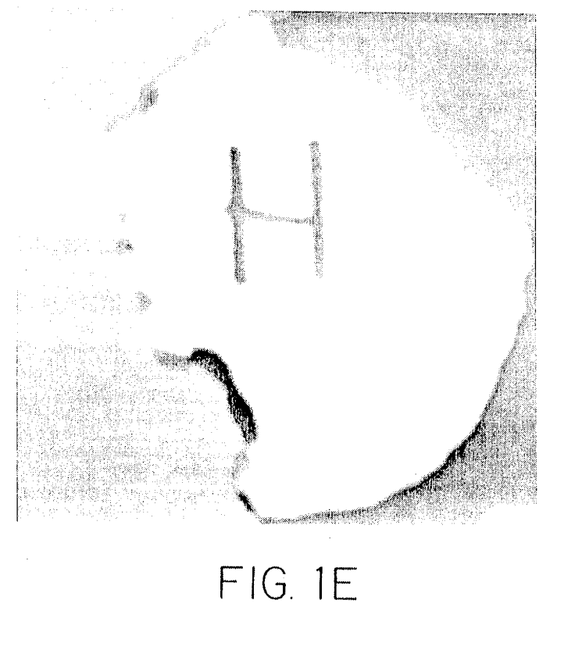
Figure 1F:
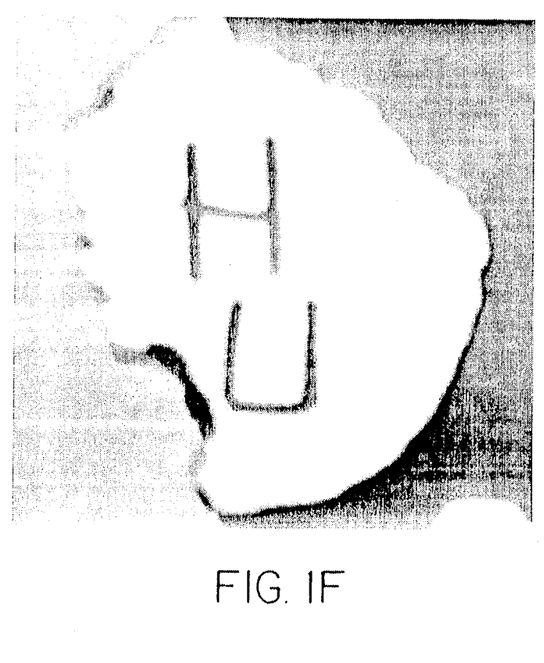

An important criteria for any reliable and potentially practical machining process is that the cutting tool (in our case the AFM tip) undergoes minimal wear compared to the substrate. To examine this issue and to determine the complexity and reproducibility of the patterns that can be created we have nanomachined a series of lines to pattern "H U", which stands for Harvard University, in the $MoO_3$ (FIGS. 1D-1F). Importantly, we find that the resolution does not degrade during this series of nanomachining operations. In addition, the resulting HU structure is stable during continuous imaging with loads $\leq 10^{-8}$N. Our work thus demonstrates that it is possible to create complex, durable, and high-resolution patterns in the $MoO_3$ thin layers. There are several applications that one can envision with this system. First, it is possible using our technology to fabricate nanometer resolution diffraction gratings. The length of the grating lines would not be limited to the size of the crystallites produced by oxidation since it is possible to deposit uniform crystalline films of $MoO_3$ on $MoS_2$ using laser ablation (19). It also will be interesting to consider using patterned $MoO_3$ films as masks for high-resolution X-ray lithography. In a more general sense, it should be possible to utilize these ideas for nanomachining other inorganic thin layers, such as $SiO_x$ on Si, when the substrate (e.g., Si) wears at a rate significantly slower than the inorganic coating (e.g., $SiO_x$) [20].

Figure 2A:
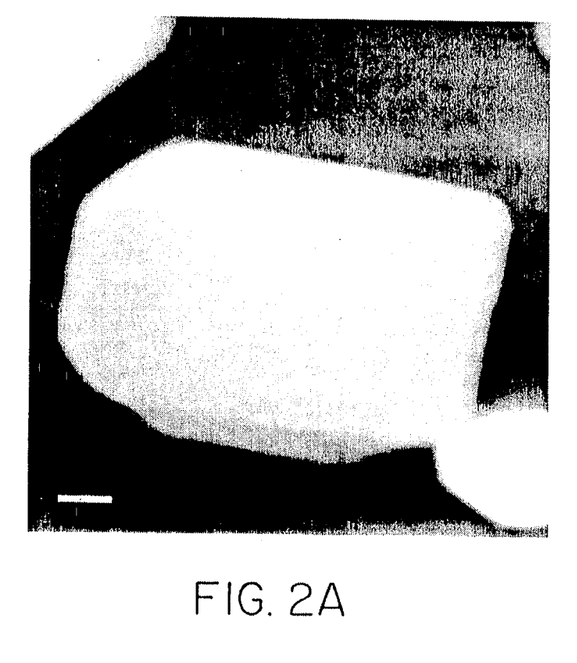
FIGS. 2A-2E show a series of images of a $MoO_3$ crystallite on $MoS_2$ recorded with an applied load of $1 \times 10^{-8}$N.
Figure 2B:
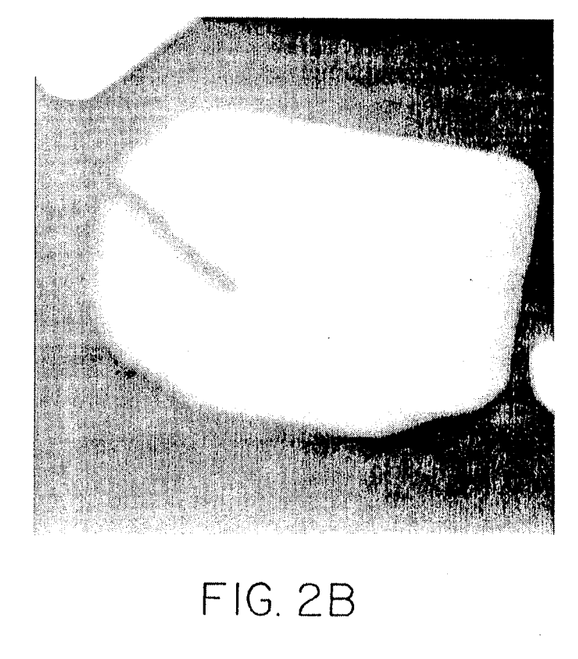
Figure 2C:
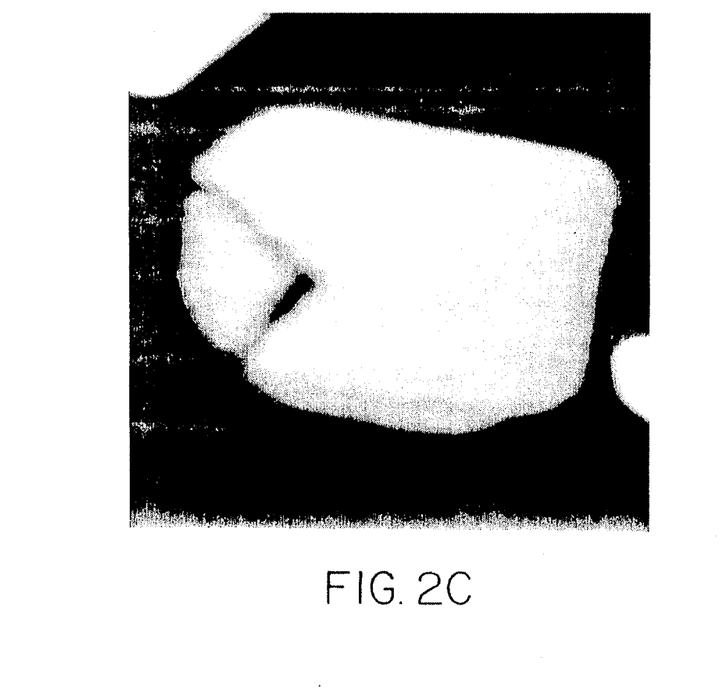
Figure 2D:
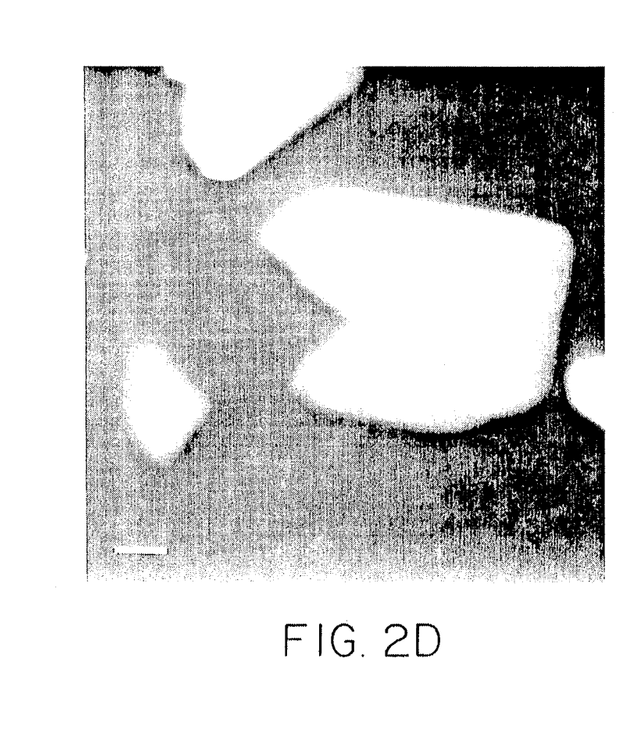
Figure 2E:
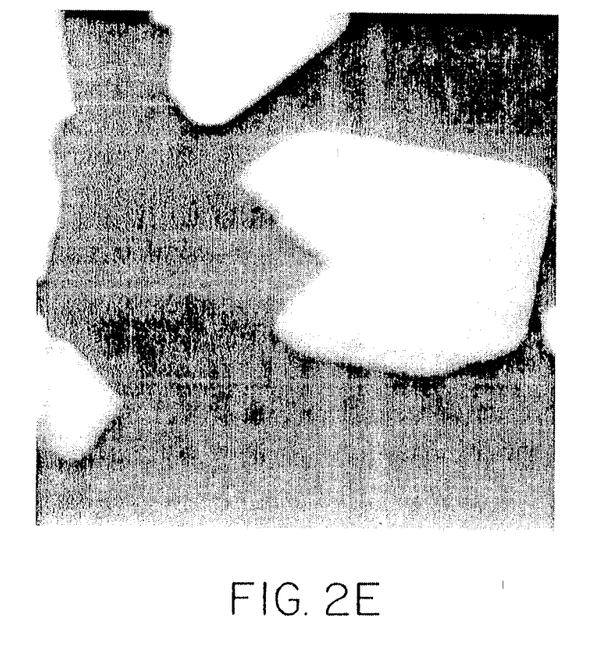

We can also go beyond the level of simply patterning a surface and make distinct objects that can be manipulated and in principle incorporated into complex nanostructures. The basis for this new idea is the fact that the $MoO_3$ crystallites are not strongly bound to the underlying $MoS_2$ substrate; therefore, it is possible to separate nanomachined $MoO_3$ objects from the $MoS_2$ surface. This concept is demonstrated in FIG. 2. In this series of AFM images we first define a triangle at the edge of a $MoO_3$ crystallite (FIG. 2A-C). The line pattern defining the triangle was machined using a force of $1 \times 10^{-7}$N (21). The most remarkable feature of this series images is that the triangular structure patterned at the edge of the $MoO_3$ can be separated from the original crystallite by scanning across the entire crystal with a force of $\simeq 1 \times 10^{-7}$N (FIG. 2D). In FIG. 2D the triangular object was moved $\simeq 100$ nm after a single high load scan. We can further manipulate the triangular $MoO_3$ object on the $MoS_2$ using this procedure, and show a second $\simeq 100$ nm translation step in FIG. 2E. Importantly, these translation steps can be imaged without perturbation by using low loads ($\leq 10^{-8}$N). Hence, we are not only able to nanomachine free objects, but we can also translate and observe these objects on the $MoS_2$ surface using an AFM tip. The objects we create and manipulate with the AFM are several orders of magnitude smaller than those currently produced by micromachining techniques (22). For future applications it is important to note that the electronic properties of $MoO_3$ can be readily varied from insulating through metallic by doping, and that $MoO_3$ and related metal oxides exhibit photochomism. Because it should be possible to lift these small objects electrostatically with the tip (in addition to translating them), it is interesting to speculate whether one can assemble nanostructures possessing novel electrical and optical properties using these techniques.

References and Notes
1. For recent reviews see: *Science* 254, 1300-1342 (1991); P. Ball and L. Garwin, *Nature* 355, 761 (1992).
2. I. W. Lyo and Ph. Avouris, *Science* 253, 173 (1991).
3. D. Cleary, *New Sci.* 129, 31 (1991); J. L. Huang, Y. E. Sung, C. M. Lieber, submitted for publication.
4. D. M. Eigler and E. D. Schweizer, *Nature* 344, 524 (1990).
5. J. A. Stroscio and D. M. Eigler, *Science* 254, 1319 (1991).
6. D. M. Eigler, C. P. Lutz, W. E. Rudge, *Nature* 352, 600 (1991).
7. L. J. Whitman, J. A. Stroscio, R. A. Dragoset, R. J. Celotta, *Science* 251, 1206 (1991).
8. C. R. K. Marrian, E. A. Dobisz, R. J. Colton, *J. Vac. Sci. Technol. A* 8, 3563 (1990); E. A. Dobisz and C. R. K. Marrian, *Appl. Phys. Lett.* 58, 2526 (1991).
9. J. A. Dagata et al., *Appl. Phys. Lett.* 56, 2001 (1990).
10. H. J. Mamin, S. Chiang, H. Birk, P. H. Guethner, D. Rugar, *J. Vac. Sci. Technol. B* 9, 1398 (1991).
11. G. Dujardin, R. E. Walkup, Ph. Avouris, *Science* 255, 1232 (1992).
12. G. S. Blackman, C. M. Mate, M. R. Philpott, *Vacuum* 41, 1283 (1990).
13. O. M. Leung and M. C. Goh, *Science* 255, 64 (1992).
14. Y. Kim, J.-L. Huang, C. M. Lieber, *Appl. Phys. Lett.* 59, 3404 (1991).
15. E. Delawski and B. A. Parkinson, *J. Am. Chem. Soc.* 114, 1661 (1992).
16. Y. Kim and C. M. Lieber, in preparation.
17. In air, the $MoO_3$ and $MoS_2$ surfaces wear in an uncontrolled manner. A strong adhesive interaction between the tip and sample, which is due to adsorbates, is believed to be responsible in large part for this observed wear. With the glove box, however, the $MoS_2$ surface does not wear on our experimental time scale, and the wear of the $MoO_3$ can be controlled by the applied load.
18. Lines with similar widths but only 3 Å deep have been formed previously in the metallic oxide $Rb_{.3}MoO_3$ by an unknown process using an STM: E. Garfunkel et al., *Science* 246, 99 (1989).
19. C. Niu and C. M. Lieber, unpublished results.
20. A stable tip is required to obtain reproducible nanomachining. For other oxide systems the $Si_3N_4$ tips may not be sufficiently robust; however, cantilevers with diamond tips should be applicable to a wide range of materials.
21. The line resolution at the surface of the $MoO_3$ is lower than in FIG. 1 since this crystallite is three times thicker (42 Å) than the one unit cell thick $MoO_3$ layer patterned with HU.
22. K. D. Wise and K. Najafi, *Science* 254, 1335 (1991).
23. C.M.L. acknowledges support of this work by the Air Force Office of Scientific Research and the David and Lucile Packard Foundation. Y. K. dedicates this work to Professor S. J. Kim on the occasion of his 60th birthday.

Figure Captions.

FIG. 1. A series of $500 \times 500$ nm² AFM images that depict the patterning of a $MoO_3$ crystallite with the letters "HU". All of the images were recorded with an applied load of $1 \times 10^{-8}$N. (A) $500 \times 500$ nm² image of $MoO_3$ grown on the surface of a $MoS_2$ single crystal. The irregular shaped object occupying the central portion of this image is the $MoO_3$ crystallite and the surrounding regions correspond to the $MoS_2$ substrate. The insets shown in the lower and upper corners of this figure are atomic resolution images ($3.5 \times 3.5$ nm²) recorded on the $MoS_2$ and $MoO_3$ areas, respectively; the lattice parameters and symmetry of these images confirm the material assignment (see text). (B) A line machined in the $MoO_3$ crystal using an applied load of $5 \times 10^{-8}$N. (C) Zoomed view of this structure rendered as a three dimensional line scan. A single scan across the line is also shown in the upper portion of this image. (D-F) $500 \times 500$ nm² images illustrating sequential machining of the $MoO_3$ crystallite to define the HU pattern. The white bar in (A) represents 50 nm and defines the length scale for A,B,D-F.

FIG. 2. (A-C) A series of 450×450 nm² images of a MoO₃ crystallite on MoS₂ recorded with an applied load of $1 \times 10^{-8}$N. Two lines were machined through the left side of the MoO₃ (using a load of $1 \times 10^{-7}$N) to define a triangular object (C). The white bar in (A) corresponds to 45 nm and defines the length scale for A-C. (D,E) 600×600 nm² images that illustrate the translation of the triangular MoO₃ structure on the MoS₂ surface. In (D) the triangle has been moved ≃100 nm from its position in (C). It was translated an additional 100 nm before recording image (E). Images D and E were recorded with an applied load of $1 \times 10^{-8}$N; translation was carried out using a higher load, $1 \times 10^{-7}$N. The white bar in (D) corresponds to 60 nm and defines the length scale for D and E.

We claim:

1. A method for machining oxide thin-films, comprising the steps of:
    a) employing an atomic force microscope to pattern lines on the oxide thin film; and
    b) imaging a resulting structure by controlling an applied load of a tip of the atomic force microscope.

* * * * *

UNITED STATES PATENT AND TRADEMARK OFFICE
CERTIFICATE OF CORRECTION

PATENT NO. : 5,252,835
DATED : October 12, 1993
INVENTOR(S) : Charles M. Lieber and Yun Kim It is certified that error appears in the above-identified patent and that said Letters Patent is hereby corrected as shown below:

In Column 1, after the title, insert the following paragraph:

--This invention was made with government support under Contract No. AFOSR-90-0029 awarded by the U.S. Air Force. The government has certain rights in the invention.--

Signed and Sealed this

Twentieth Day of June, 1995

*Attest:*

BRUCE LEHMAN

*Attesting Officer*    *Commissioner of Patents and Trademarks*